United States Patent
Chapel et al.

(10) Patent No.: US 10,655,771 B2
(45) Date of Patent: May 19, 2020

(54) AIR-BASED COOLING FOR DATA CENTER RACK

(71) Applicant: Zonit Structured Solutions, LLC, Boulder, CO (US)

(72) Inventors: Steve Chapel, Iliff, CO (US); William Pachoud, Boulder, CO (US)

(73) Assignee: Zonit Structured Solutions, LLC, Boulder, CO (US)

( * ) Notice: Subject to any disclaimer, the term of this patent is extended or adjusted under 35 U.S.C. 154(b) by 0 days.

(21) Appl. No.: 15/919,944

(22) Filed: Mar. 13, 2018

(65) Prior Publication Data
US 2019/0069449 A1    Feb. 28, 2019

Related U.S. Application Data

(63) Continuation of application No. 15/353,590, filed on Nov. 16, 2016, now Pat. No. 9,918,413, which is a continuation of application No. 13/889,181, filed on May 7, 2013, now Pat. No. 9,618,270, which is a continuation of application No. 12/531,215, filed as
(Continued)

(51) Int. Cl.
| | | |
|---|---|---|
| *H05K 7/20* | (2006.01) | |
| *F16K 11/078* | (2006.01) | |
| *F16L 37/38* | (2006.01) | |
| *F28D 7/10* | (2006.01) | |
| *F16L 37/46* | (2006.01) | |

(52) U.S. Cl.
CPC .......... *F16L 37/38* (2013.01); *F16K 11/0785* (2013.01); *F28D 7/10* (2013.01); *H05K 7/20745* (2013.01); *H05K 7/20836* (2013.01); *F16L 37/46* (2013.01)

(58) Field of Classification Search
CPC ....... F16L 37/38; F16L 37/46; F16K 11/0785; F16K 11/072; H05K 7/20836; H05K 7/20745; H05K 7/206
See application file for complete search history.

(56) References Cited

U.S. PATENT DOCUMENTS 1,933,117 A * 10/1933 Markle .................. F16L 55/10
220/265
3,077,330 A *  2/1963 Lampbear ................. F16K 1/22
251/149.2
(Continued)

FOREIGN PATENT DOCUMENTS

CN       2515586 Y    10/2002
CN       1909288 A     2/2007

OTHER PUBLICATIONS

Chinese Office Action, dated Jul. 27, 2018, for Application No. 201510646140.0.

*Primary Examiner* — Devon Russell
(74) *Attorney, Agent, or Firm* — Davis Graham & Stubbs LLP

(57) ABSTRACT

A high-velocity low-pressure cooling system (100), especially suited for data center applications, includes an air coolant loop (102), a non-air coolant loop (104) and a cooler unit (126) for heat transfer between the loops (102 and 104). The air loop (102) is used to chill ambient air that is blown across heat transfer surfaces of equipment mounted in data center racks (110). In this manner, effective cooling is provided using a coolant that is benign in data center environments.

3 Claims, 10 Drawing Sheets

Related U.S. Application Data application No. PCT/US2008/057131 on Mar. 14, 2008, now Pat. No. 8,453,471.

(60) Provisional application No. 60/894,844, filed on Mar. 14, 2007.

(56) References Cited

U.S. PATENT DOCUMENTS

| | | | | |
|---|---|---|---|---|
| 3,127,148 | A * | 3/1964 | Collar | F16L 29/007 |
| | | | | 137/527 |
| 4,178,638 | A * | 12/1979 | Meyer | A61F 2/2403 |
| | | | | 137/512 |
| 4,209,037 | A * | 6/1980 | Upham | F16K 15/035 |
| | | | | 137/512 |
| 4,351,358 | A * | 9/1982 | Ogle, Jr. | F16K 15/035 |
| | | | | 137/512.1 |
| 4,586,694 | A * | 5/1986 | Jones | F16L 37/38 |
| | | | | 251/149.2 |
| 4,597,767 | A * | 7/1986 | Lenkei | A61F 2/2403 |
| | | | | 137/512 |
| 4,749,214 | A * | 6/1988 | Hoskins | F16L 37/38 |
| | | | | 285/110 |
| 5,787,927 | A * | 8/1998 | Johnson | F16L 37/23 |
| | | | | 137/614.02 |
| 7,716,939 | B1 * | 5/2010 | Morales | H05K 7/20836 |
| | | | | 361/688 |
| 2007/0019391 | A1 | 1/2007 | Xu et al. | |

* cited by examiner

AIR-BASED COOLING FOR DATA CENTER RACK

CROSS-REFERENCE TO RELATED APPLICATION

This application claims priority to and is a continuation of U.S. patent application Ser. No. 15/353,590, entitled, "AIR-BASED COOLING FOR DATA CENTER RACK," filed on Nov. 16, 2016, which is a continuation of U.S. patent application Ser. No. 13/889,181, entitled, "AIR-BASED COOLING FOR DATA CENTER RACK," filed on May 7, 2013, which is a continuation of U.S. patent application Ser. No. 12/531,215, entitled, "AIR-BASED COOLING FOR DATA CENTER RACK," filed on Mar. 1, 2010, which is a national stage of PCT Application PCT/US2008/057131, entitled, "AIR-BASED COOLING FOR DATA CENTER RACK," filed on Mar. 14, 2008, which in turn claims the benefit of U.S. Provisional Application No. 60/894,844, entitled, "AIR-BASED COOLING FOR DATA CENTER RACK," filed on Mar. 14, 2007. The contents of all of the above-noted applications are incorporated herein as if set forth in full and priority to all of these applications is claimed to the full extent allowable under U.S. law and regulations.

FIELD OF INVENTION

The present invention is generally directed to cooling electronic equipment and, in particular, to a cooling system for electrical equipment that uses air as a coolant fluid. The invention has particular utility in the context of cooling rack-mounted electrical equipment such as in a data center.

BACKGROUND OF THE INVENTION

Certain types of electronic equipment generate considerable heat during operation. Cooling such equipment can be problematic, particularly when a number of devices are crowded together in a compact space. The case of data centers is illustrative. Certain types of data processing equipment produce a large amount of heat in a small form factor. For example, blade servers have multiple heat producing CPUs on boards that slide into a compact backplane chassis.

Currently, the typical approach to cooling such equipment in a data center is via general air conditioning of the data center room using a computer room air conditioning or "CRAC" unit. However, this is an inefficient means to address hotspots associated with devices, as noted above, that generate significant heat. In particular, these devices typically blow cool air into the plenum space beneath the data center floor. The cool air is then drawn up through the data center where heat is extracted from the equipment via convection. Even if the cooling capacity of such a system is increased, e.g., by increasing the volume of air passed through the data center or further cooling the air, such systems are only marginally efficient at addressing such hotspots.

An alternative is water cooling systems that use water or another fluid coolant. Water cooling was used extensively in data centers in the 1960s through the 1980s, especially data centers employing mainframe computers. Theoretically, such water cooling, or cooling using another coolant, could be employed in modern data centers, and some development effort has been initiated in this regard. However, modern data centers typically employ many network devices and many other data processing peripherals. The result has been an explosion in the amount of data cabling, power conduits and fiber under the data center raised floor. All of this cabling complicates the plumbing that would be required for cooling using conventional coolants. Moreover, modern data centers may be frequently reconfigured to address changing needs. It will be appreciated that the initial data center configuration and any reconfiguration may be constrained by plumbing issues and could require specialized plumbing service providers in addition to the other service providers employed in such data center projects. In addition, it will be appreciated that any leakage of water from such cooling systems would be potentially hazardous to personnel and equipment.

SUMMARY OF THE INVENTION

The present invention is directed to a cooling system, especially for rack-mounted electrical equipment, that uses air as a coolant fluid. The system reduces the likelihood of damage to electrical components due to any leakage of the coolant fluid. In addition, novel conduits and connectors are provided for the cooling system that enables the system to be easily reconfigured as may be desired to accommodate data center configuration and reconfiguration. Similarly, cooling system capacity can be easily increased and decreased by adding or removing modular cooling units. Moreover, in one implementation, the system includes chiller units that can be embodied as replacement doors for equipment racks so as to create and direct chilled air to potential equipment hotspots.

In accordance with one aspect of the present invention, air is used as a cooling fluid in a system for cooling electronic equipment. The associated method and apparatus ("utility") involves providing a closed-loop coolant circuit and flowing air through the closed-loop coolant circuit such that the air functions as a coolant fluid. In this regard, the air used as the coolant fluid can be chilled, e.g., to about −40° F. or about −40° C., for example, by heat exchange with a separate coolant loop safely separated from the electronic equipment. Heat is then exchanged between the closed loop coolant circuit and ambient air so as to cool the ambient air. The cooled ambient air can then be flowed across a heat transfer surface of the electronic equipment to extract heat from the electronic equipment. As noted above, the use of air as a coolant fluid in this regard significantly reduces or substantially eliminates the possibility of damage to electronic equipment due to any leakage of the coolant fluid. The air can be at a relatively low pressure which simplifies construction, reduces maintenance and enhances reliability. In order to provide sufficient cooling in such cases, the air may be circulated at a high velocity. Each of these related aspects (low pressure and high velocity) is novel in its own right.

In accordance with another aspect of the present invention, a utility for cooling electronic equipment utilizes low-pressure air as a closed-loop coolant. Specifically, the utility involves providing a closed-loop coolant circuit, using air as the coolant in the closed-loop coolant circuit and operating the closed-loop coolant circuit at a pressure of no more than about 100 psi. In one implementation, the pressure of the coolant fluid is no more than about 48 psi. The system allows for simple construction and reconfiguration with reduced maintenance costs in relation to certain existing cooling systems. In a preferred implementation, a high velocity, low pressure (HVLP) air based cooling system is provided by combining the high velocity and low pressure aspects described above.

Thus, in accordance with a further aspect of the present invention, a cooling system is provided that circulates air in a closed-loop at a high circulation speed. The associated utility involves providing a closed-loop coolant circuit using air as a coolant in the closed-loop coolant circuit and operating the closed-loop coolant circuit at a coolant circulation speed of at least about 50 mph. In one implementation, the speed of the coolant fluid is between about 75 mph and 90 mph. As noted above, certain advantages are obtained by using low-pressure air as a coolant fluid. These advantages can be realized while still providing significant cooling capacity by circulating the coolant fluid at a high speed.

In accordance with a still further aspect of the present invention, a cooling system for cooling electronic equipment in standard equipment racks is provided that enables cooling capacity to be customized for particular applications, e.g., configuration and reconfiguration of data centers. The utility involves a number of cooling modules wherein each module includes a cooling unit with cooling capacity sufficient for cooling more than one, but less than about ten racks. Each module further includes a modular frame adapted to securely interconnect with other modular frames in a number of possible configurations. In this manner, the cooling capacity can easily be increased or decreased by adding or removing modules. Additionally, the modules can be assembled together in different two- or three-dimensional configurations, depending on space requirements/availability.

In accordance with another aspect of the present invention, a specialized conduit apparatus is provided for use in connection with cooling systems that employ air as a coolant fluid. The conduit apparatus includes an inner conduit defining a passageway for the coolant air, an outer conduit encompassing the inner conduit and a spacing structure for maintaining spacing between an outer surface of the inner conduit and an inner surface of the outer conduit. The spacing between the inner and outer conduits accommodates a volume of insulating air. This spacing could also be used to route wiring for use in controlling a rack chiller as described below. Alternatively, the outer conduit space can be utilized for the return air path eliminating the need for a second air conduit. Alternatively, a wiring conduit can be found on an outer surface of the outer conduit for this purpose. In addition, an insulating material may be disposed on the outer surface of the outer conduit for acoustic and thermal insulation. The noted conduit apparatus allows for circulation of high speed chilled air without condensation forming on the conduit, as may be desired for various applications, including cooling electronic equipment.

In accordance with yet another aspect of the present invention, a specialized connector apparatus is provided for use in a closed-loop, air based coolant circuit. The connector apparatus includes a plurality of fingers (which may be formed from plastic, metal or any other suitable material) that are movable between an open configuration and a closed configuration. In the open configuration, the fingers are separated to allow flow of coolant air through a conduit. For example, the fingers may be flush with the conduit wall in the open configuration. In the closed configuration, the fingers are drawn together to substantially prevent flow of the coolant air through the conduit. For example, the fingers, when drawn closed, may form a shape like the head of a bullet. The connector apparatus further includes an actuating mechanism for moving the fingers from the closed configuration to the open configuration when the associated closed-loop system is connected and air is flowing. In this regard, the fingers may automatically open in response to air pressure (pressure differential) under these conditions and may automatically close (again, responsive to a pressure change) when a connection is disconnected such that high velocity air is not discharged into the ambient environment.

In accordance with a further aspect of the present invention, a rack chiller apparatus is provided. The apparatus includes a door structure extending across one side of the rack. The door structure includes ventilation openings. The apparatus further includes fans for drawing the ambient air through the openings of the door and directing the then chilled ambient air to a heat transfer surface of electronic equipment. A chiller unit associated with the door structure chills the ambient air drawn through the ventilation openings. For example, door structures may be provided on both the front and back surfaces (without a chiller unit) of a rack for improving the flow of chilled air thereacross. Different zones with different target temperatures may be defined within a given rack. The temperatures may be set by using controls provided for each zone. For example, on one vertical level of the rack, chiller fans may be controlled to chill the ambient air before it is blown on the heat transfer surface of the equipment at that level to meet the desired target temperature in that vertical zone. On another level, fans may be controlled to be idle or maintain a different target temperature. In addition, the air leaving the rack (now heated due to heat transfer) may be chilled to reduce the heat discharged to the room.

BRIEF DESCRIPTION OF THE DRAWINGS

For a more complete understanding of the present invention and further advantages thereof, reference is now made to the following detailed description, taken in conjunction with the drawings in which.

DETAILED DESCRIPTION

In the following description, the invention is set forth in the context of an air-based cooling system for data center applications. As discussed above, this is a particularly advantageous application of the present invention due to, among other things, the crowded cabling environment in such contexts, the presence of a number of hotspots and different cooling requirements for different equipment within such environments, the hazards or difficulties associated with water or other fluid coolants in such environments, and the need for flexibility in configuring and reconfiguring equipment in such environments. Nonetheless, it will be appreciated that various aspects of the invention are applicable in other contexts including other environments involving electronic equipment. Accordingly, the following description should be understood as exemplifying the invention and not by way of limitation.

Figure 1:
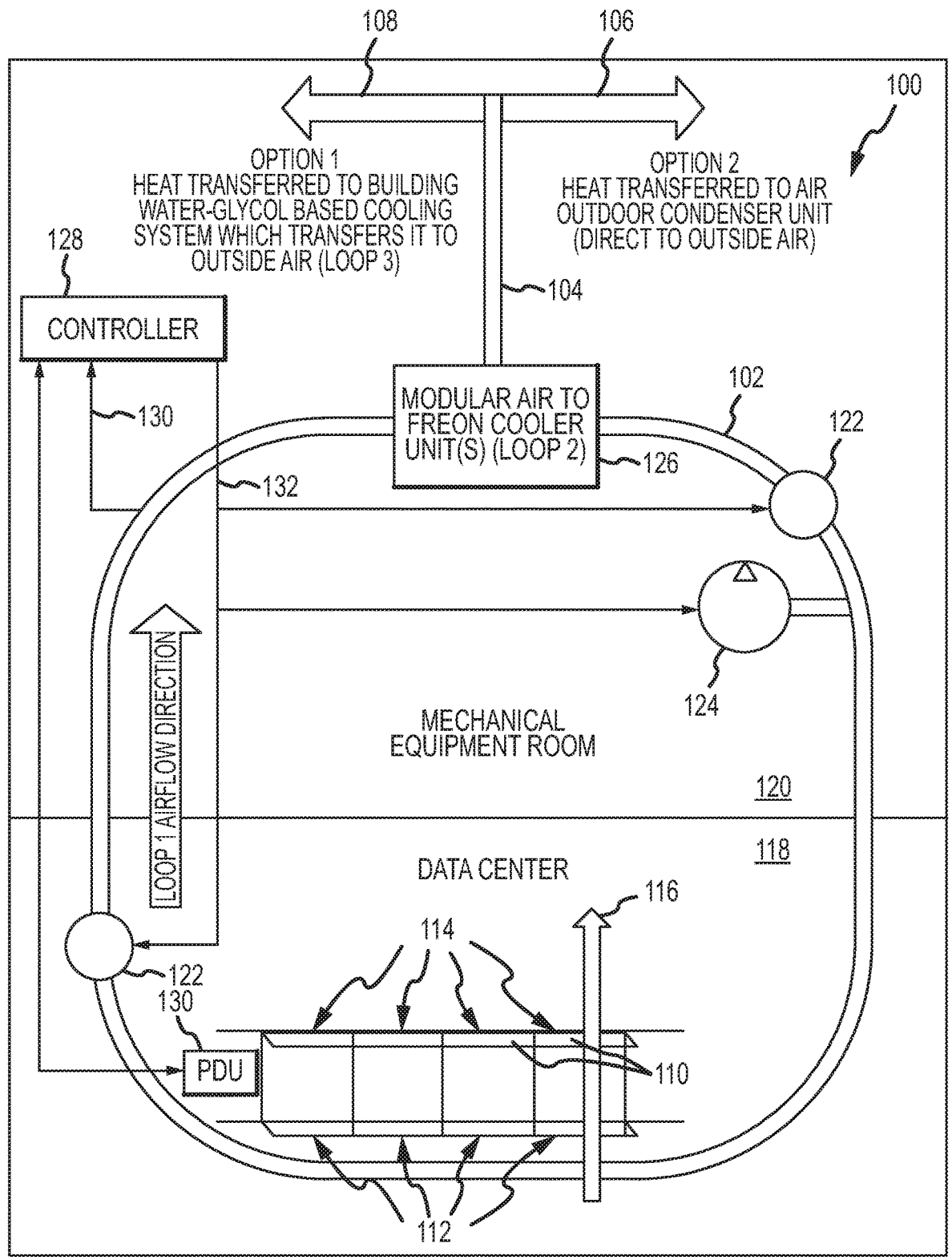
FIG. 1 is a schematic view of an air-based cooling system in accordance with the present invention.

Referring to FIG. 1, a high-velocity low-pressure (HVLP) cooling system 100 in accordance with the present invention is shown. The system 100 generally includes an air coolant loop 102, a non-air coolant loop 104 and a cooler unit 126 for heat transfer between the air loop 102 and the non-air loop 104.

As will be described in more detail below, the air loop 102 is used to chill ambient air that is blown across heat transfer surfaces of equipment mounted in data center racks 110 as indicated by arrow 116, so as to cool the equipment. In this process, heat is transferred from the ambient air to the air loop 102. Accordingly, heat is transferred from the air loop 102 to the non-air loop 104 by the cooler unit 126. The non-air loop 104, in turn, may either transfer heat directly to outside air via an outdoor condenser unit, as generally indicated by arrow 106, or may transfer air to a building cooling system (e.g., a water-glycol based cooling system), which in turn transfers it to the outside air, as indicated by arrow 108. Paths 106 and 108 will thus generally represent optional and alternative implementations of the system 100.

Generally, the final mechanism for transferring heat to outside air, as indicated by arrows 106 and 108, will be existing building facilities and are site specific. For example, these elements may include building chillers or cooling towers and/or an outdoor condenser unit. The non-air loop 104 may use any appropriate coolant such as Freon. In this regard, the cooler unit 126 may be a conventional unit such as an air-to-Freon cooler unit. As will be understood from the description below, the system may be implemented as a number of modular units where each unit has cooling capacity sufficient for only a subset of a typical data center environment, e.g., 4-8 racks. Accordingly, the cooler unit 126 may be selected to provide heat transfer capacity sufficient for this purpose. In particular, the cooler unit 126 may be sized to facilitate the modular functionality of the present invention. Moreover, the cooling units 126 may be packaged into a modular frame as described below.

Loop 102 is a closed-loop that uses air as a coolant. The air in loop 102 is maintained at a relatively low pressure, in relation to, for example, Freon-based systems, but is transmitted within the loop 102 at a fairly high speed. It will be appreciated in this regard that the use of a less dense, lower pressure coolant will generally require that a higher volume of the coolant be passed across a heat transfer surface in order to achieve the desired heat transfer effect. It is desirable, in this application, to maintain the pressure in loop 102 below about 5 atmospheres (80 psi) so as to facilitate the modular functionality of the invention and associated tubing connections and disconnections. In the illustrated embodiment, the air in loop 102 is maintained at about 3 atmospheres (48 psi). As discussed above, the use of such a low pressure coolant generally means that higher coolant speeds will be required to achieve the desired heat transfer capacity. Accordingly, it is desirable to drive the air within loop 102 at a speed in excess of 50 mph for typical data center applications. In the illustrated embodiment, the air in loop 102 is driven at a speed of between about 75-90 mph.

To achieve the desired air circulation and other air properties, the illustrated loop 102 includes one or more circulation pumps 122 and one or more air compressor and dryer units 124. The pumps 122 drive the air in the loop 102 at the desired speeds as discussed above. Any appropriate pumps may be used in this regard. The illustrated pumps 122 are spool-type pumps, as commonly used in automobile turbo charging applications, except with an electric motor being used as the power source rather than an exhaust gas stream.

The air compressor and dryer unit 124 dehumidifies the air injected into the system and pressurizes the air so that the desired air pressure level in the closed loop is maintained. In order to achieve the desired heat transfer effect, the cooler unit 126 maintains the air in the loop 102 at a low temperature. The specific temperature depends on a number of factors including the needs of the particular data center application, ambient temperature and humidity levels and the insulating properties of the conduits from which the loop 102 is constructed. In particular, it may be desired to control operation of the system 100 such that the external surface temperature of the loop 102 is maintained within a controlled temperature band so as to avoid excess condensation that may be hazardous in a data center environment. For example, it may be desired to maintain the temperature of the external surface of the loop 102 within a temperature band of about 40° F.-60° F., for example, between about 50° F.-55° F. However, the air within the loop 102 may be maintained at a considerably colder temperature when an insulating conduit structure, as will be described below, is employed. In this regard, the air within the loop 102 may be maintained at temperatures below freezing, for example, about −40° F. The air compressor and dryer unit 124 thus reduces the humidity level of air injected into the loop 102, and reduces the humidity level of air introduced into the loop 102 due to reconfiguration of the system, so that water does not freeze in the loop 102.

As shown, the non-air loop 104 and associated components are preferably disposed outside of the data center 118, for example, in a mechanical equipment room 120. In this manner, air is the only coolant introduced into the data center 118 and any leakage of non-air coolants will be restricted to areas outside of the data center 118. The air in the loop 102 is used to cool equipment disposed in the racks 110. Generally, this may be accomplished by using the loop 102 to cool ambient air, which can then be blown across heat transfer surfaces of the equipment. As the racks 110 are typically organized side-by-side in rows, this can generally be most effectively accomplished by blowing the ambient air in a front-to-back or back-to-front direction across the equipment. The illustrated system blows air from front-to-back as generally indicated by the arrow 116. This can be done by disposing one or more fans either in front of or behind a rack 110 and, for many applications, fans associated with a chiller on the front side of the racks 110, to cool ambient air before it is delivered to the equipment, will be sufficient. In the illustrated embodiment, the front doors of the racks 110 are replaced with air-to-air chillers with integrated fans 112, and the rear panels of the racks 110 are replaced with optional air flow boost doors with integrated fans 114.

Figure 2A:
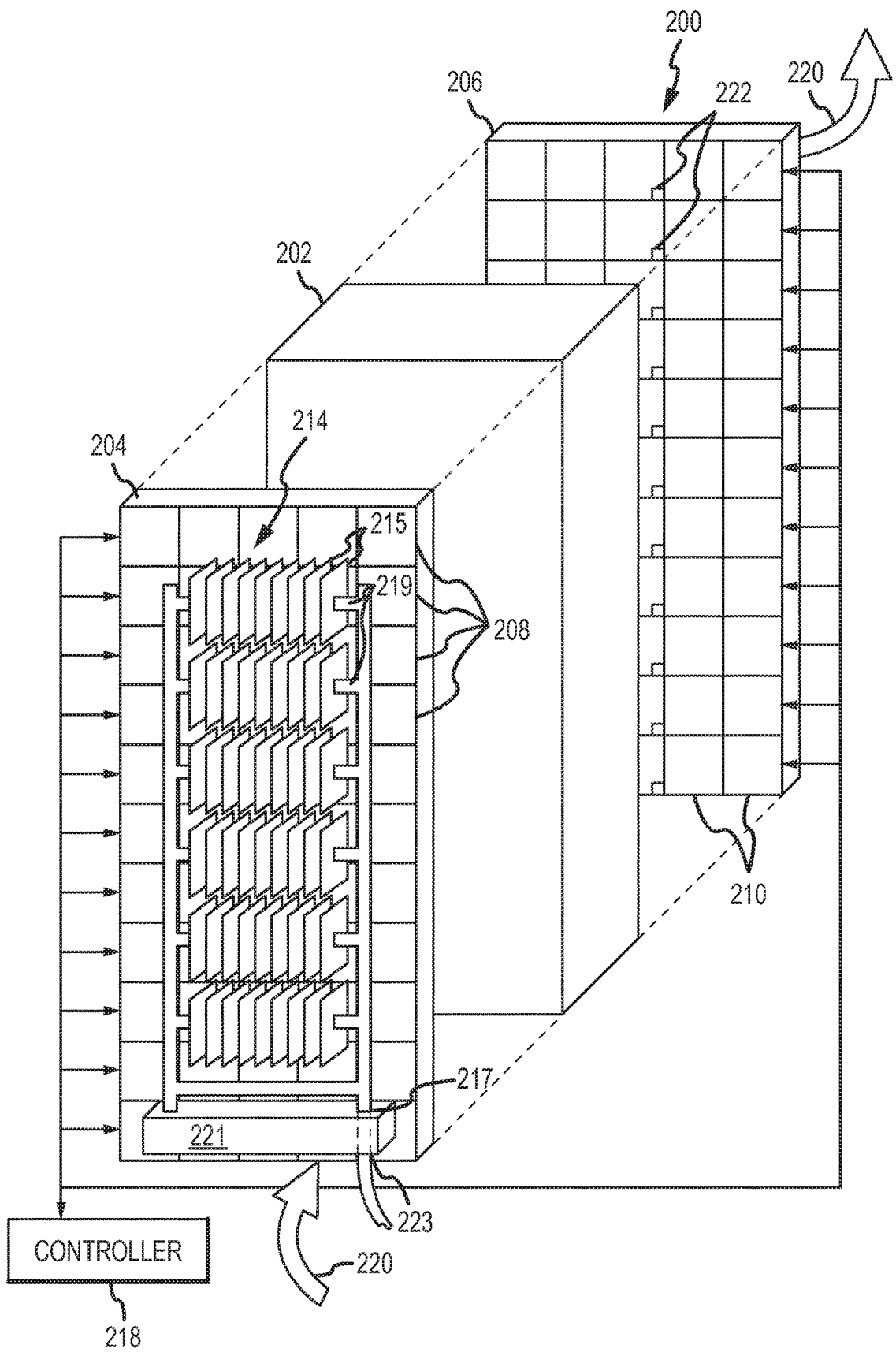
FIG. 2A is an exploded perspective view of a data center rack with a door mounted chiller system, with the door cover panels removed for purposes of illustration, in accordance with the present invention.

This is shown in more detail in FIG. 2A. Specifically, FIG. 2A illustrates a rack assembly 200, including a front door chiller unit 204 (with the front vented cover removed for purposes of illustration) and a back door air flow boost unit 206. Although the assembly 200 is shown in an exploded view in FIG. 2A, it will be appreciated that the front door 204 will be disposed on a front surface of the rack 202 and the back door unit 206 will be disposed on a rear surface of the rack 202.

The front door unit 204 includes a chiller assembly 214 and a number of fans 208, which may be arranged in rows and columns. The chiller assembly 214 includes a number of heat transfer plates 215, that may be constructed from a heat conductive material such as any of various metals, that are chilled by cold air from input conduit 217. The chilled plates 215 extract heat from ambient air that is drawn across the plates 215 by fans 208. Alternatively, the fans could be placed in front of the chiller assembly 214 to push air there through. The plates 215, in turn, transfer heat to the coolant air circulated through the conduits 219 of the chiller assembly 214. The warmed coolant air is then exhausted to manifold 221 and, in turn, to the return conduit 223. As will be described below, the input conduit 217 and return conduit 223 may be provided in the form of coaxial tubing where the cold, supply air flows through the inner conduit and the warmed, return air flows through the outer conduit. This coaxial tubing defines the air coolant loop.

The back door unit 206 in the illustrated embodiment includes a number of fans 210 disposed in rows and columns similar to the fans 208 of the front door unit 204. The fans 208 and 210 cooperate to move air across the equipment in the rack 202 generally in the direction indicated by arrow 220. The fans 208 and 210 are preferably sized and positioned so as to provide adequate cooling and also provide the desired differential cooling for different zones of the rack 202. In the illustrated embodiment, the fans 208 and 210 are approximately 4 inches in diameter and are disposed essentially side-by-side and top-to-bottom across the full area of the units 204 and 206.

As discussed above, different equipment within a data center and, indeed, different equipment within a single rack 202 may have different cooling requirements. It is therefore preferable that the fans 208 and 210 be operated intelligently. In this regard, a controller 218 allows for differential operation of the fans. Preferably, at least the fans in different rows of each of the units 204 and 206 may be independently operated. This is because the equipment in the racks 202 are generally arranged in a vertically stacked configuration. Accordingly, there may be different cooling needs at different vertical levels of the rack 202. However, if desired, fans in different columns of either unit 204 and 206 and/or fans in the front unit 204 and back unit 206 may be operated independently. For example, in many cases, it may be unnecessary to operate any of the fans in the back unit 206 (in many cases, unit 206 may be safely omitted). Similarly, fans may be unnecessary in certain rows of the front unit 204 due to the absence of any significant heat generating equipment at that location. Optionally, louvers or similar mechanisms (mechanically operable or servo controlled) may be provided in connection with one or more of the conduits 219 so that the coolant air can be directed only to portions of the unit 204 where cooling is required.

This intelligent operation of the assembly 200 may be enhanced by the use of feedback mechanisms in the front 204 and/or back 206 units. In the illustrated embodiment, temperature sensors 222 are provided in connection with the back unit 206 so as to sense the temperature of ambient air exhausted from the rack 202 at different vertical levels (e.g., each fan row) of the rack 202. Such temperature sensors provide an indication of the cooling requirements at different vertical levels of the rack 202. The sensors 222 provide feedback to the controller 218 for use in driving the fans 208 and 210 on different rows of the units 204 and 206 and, optionally, for controlling flow of the coolant 214. In this regard, sensors (not shown) may also be provided in connection with the front unit 204 to provide temperature differential information for use in servo control.

Figure 2B:
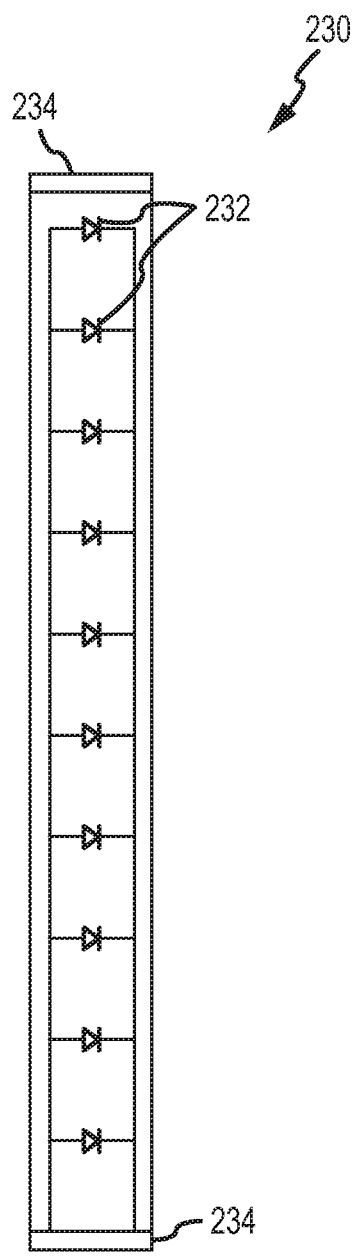
FIG. 2B is a front view, partially schematic, of a temperature sensor strip in accordance with the present invention.

FIG. 2B shows an alternative implementation for providing temperature sensors on the front and/or back door units. Specifically, FIG. 2B shows a sensor strip 230 that may be mounted or otherwise attached to the rack or the door units. The strip 230 may be rigid of flexible, e.g., in the form of a tape that can be rolled for transport and storage and then unrolled for use. In this regard, the strip 230 can be attached, at least at end portions 234 thereof, to the rack or door via velcro, screws or other fasteners. The illustrated strip includes a number of temperature sensors, e.g., diodes 232 with appropriate wiring and logic for periodically reading the conductivity of the diodes 232. As is known, conductivity of diodes or changes therein is indicative of temperature. The strip 230 will generally be mounted with its longitudinal axis extending vertically on the rack or door.

Figure 2C:
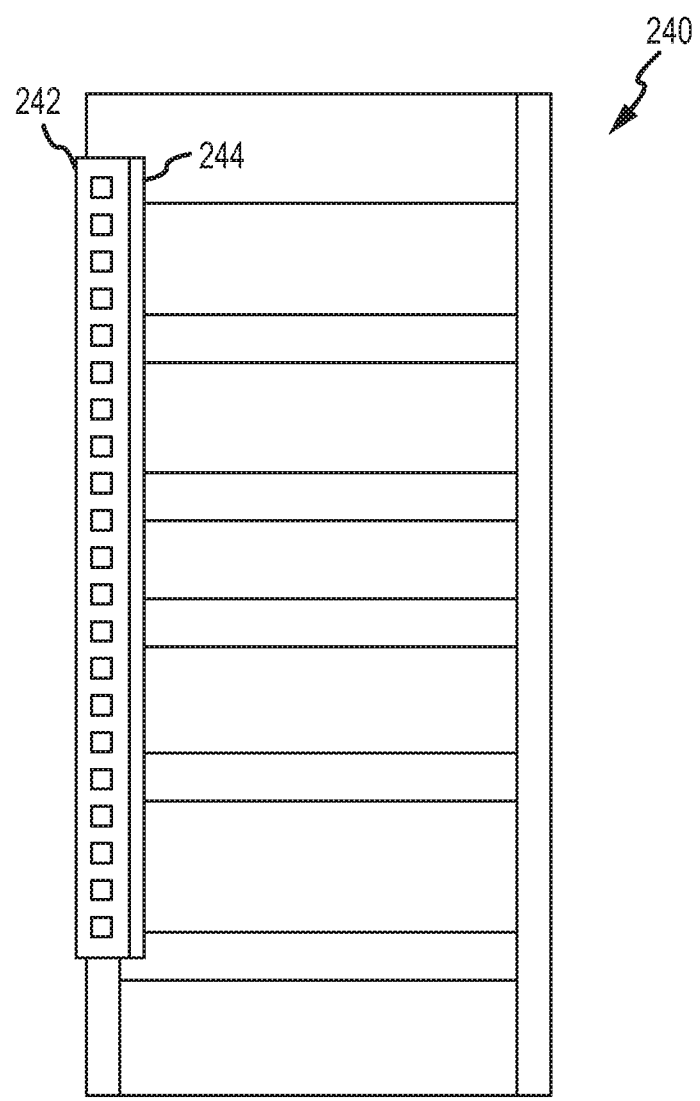
FIG. 2C is a rear view of a data center rack with a vertical power strip having a temperature sensor strip in accordance with the present invention.

FIG. 2C shows a still further embodiment for measuring temperatures at different vertical zones of a rack. In this case, the rack 240 has a vertical power strip 242 mounted thereto. For example, the power strip may be a vertical rack mount power strip marketed by Zonit Structured Solutions. The illustrated power strip 242 has a temperature sensor strip 244 integrally formed or otherwise mounted thereon. The sensor strip may be similar in construction and operation to the strip described in FIG. 2B. In any of these embodiments, appropriate circuiting is provided to return control signals to a servo control unit.

Referring again to FIG. 1, the system 100 may include a number of additional monitoring and servo control elements. With regard to the servo control of the cabinet door cooling units, any appropriate policies and rules may be employed to provide the desired cooling, and these rules may be executed by the controller 128. In this regard, not only the cooling needs, but also efficiency considerations and any other appropriate considerations may be taken into account. In the illustrated implementation, the standard cooling policy for the servo control system is to try to ensure that all of the air exhausted from the rack is of equal temperature for each vertical subsection of the rack as measured by the sensors, which may be, for example, thermo sensor strips, which transmit control signals to the controller 128 by appropriate wiring which will be discussed in more detail below. If the temperature measured at one section of the rack is hotter than at another section, the fans in the front door unit and back door unit associated with the hotter section may be run faster to provide more airflow and equalize the exhaust air temperature. This policy can be manually overridden from an LCD screen with control buttons on the front door unit that allows different vertical zones in the rack (typically at least 4 zones) to have different targeted exhaust air temperatures. It will be appreciated that data center equipment often comes with cooling specifications that dictate what the maximum exhaust air temperature from the unit should be for adequate cooling. The noted method of cooling management is well suited to accommodate such specifications.

The controller 128 also executes a main servo control function for the loop 102. This logic controls the movement of air in the loop 102. It monitors and maintains air pressure, humidity and velocity in the closed loop. The illustrated controller 128 thus receives inputs, as generally indicated by arrow 130, from appropriate pressure, humidity and velocity sensors associated with the loop 102 and provides appropriate control outputs, as generally indicated by line 132, to the pumps 122 and compressor and dryer unit 124. The controller 128 may also receive temperature inputs from the sensors on the rack door units discussed above so as to provide indication of cooling needs. This information from the rack door units may be fed to the controller 128 via serial wiring and can be used by the controller 128 to adjust the circulation rate in the loop 102.

The illustrated system 100 also includes a power distribution unit 130. The unit 130 provides power to the equipment in the racks 110. In particular, the unit 130 may be associated with redundant power sources to enable failsafe operation of critical equipment. For example, the unit 130 may be a power distribution unit marketed by Zonit Structured Solutions. In the illustrated embodiment, the unit 130 includes a processor such as a single board computer that can allow for energy consumption load balancing between the modular units, as will be discussed in more detail below. In this regard, energy cost is much lower if it is uniformly consumed rather than having usage characterized by peaks and valleys. The illustrated unit 130 thus operates as a cooling load-leveler and scheduler. It communicates with the main servo control of each module and monitors overall cooling status and load. It then schedules cooling cycles for each module to optimize energy usage patterns.

This controller may also communicate with power management logic of the unit 130. In particular, the cooling data history and status can be communicated to such logic of the unit 130, which can maintain a baseline history that can be viewed via a web interface. The unit 130 can also monitor the data center environment based on inputs from the various modules. In this manner, isothermal contours and convection patterns can be displayed for analysis and further optimization of system operation.

Figure 3A:
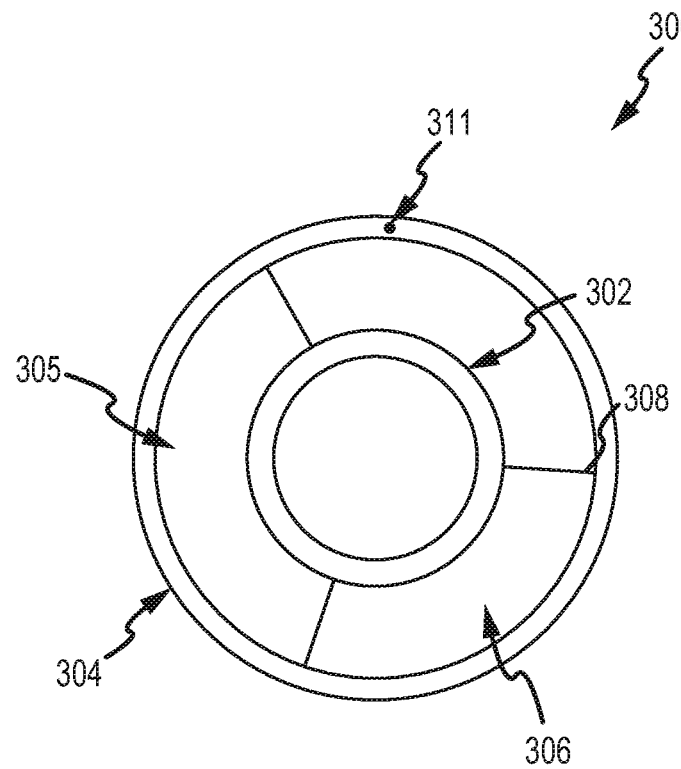
FIG. 3A is a cross-sectional view of tubing for an air-based cooling system in accordance with the present invention.

FIG. 3A shows tubing 300 that may be employed in the air coolant loop. The illustrated tubing 300 includes an inner conduit 302 and an outer conduit 304 separated by a space 306. Radial ribs 308 are utilized to provide the desired spacing. As discussed above, the inner conduit 302 may carry the cold supply air to the racks to be cooled and the outer conduit 304 may carry the warmed return air to the cooler unit. It will be appreciated that electrical wiring may be disposed within the space 306 or within a recess provided in the external surface of the tubing if desired. Alternatively, electrical wiring may be taped or strapped to the external surface of the tubing 300. In the illustrated embodiment, a conductive strand 310 is embedded in the wall of the outer conduit 304. This strand 310 can be used, for example, to serially transmit control signals to and/or from the temperature sensors or a controller for controlling the door fans.

The conduit assembly 300 is designed to carry the cooled air in the air coolant loop. The assembly 300 provides sufficient insulation in relation to the inner conduit so that condensation on the outside of the outer conduit is minimized so as to reduce or substantially eliminate water dripping that may be hazardous in a data center environment. The assembly 300 also attenuates sound so that the fast moving cooling air does not cause excessive noise. The assembly 300 is constructed from plastic having the desired insulating and sound attenuating properties and is extruded into the cross-section shown in FIG. 3A.

Figure 3B:
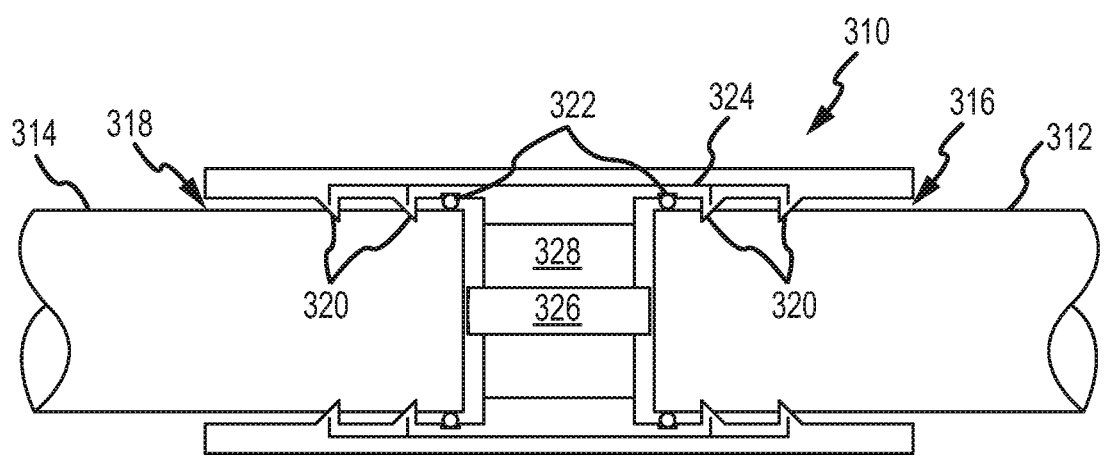
FIG. 3B is a side, partially cross-sectional view of a coupling for tubing sections in accordance with the present invention.

FIG. 3B shows a coupling unit 310 for coupling two sections of tubing 312 and 314, which may be, for example, tubing having an embedded conductive trace as discussed above. More specifically, the tubing 312 and 314 may be tubing as shown in FIG. 3A used to assemble an air coolant loop in a data center cooling application, though the coupling unit is applicable in other contexts. The illustrated coupling unit 310 is generally in the form of a sleeve having first and second recesses 316 and 318 for receiving ends of the tubing 312 and 314. The recesses are formed by walls that have teeth 320 extending radially inwardly therefrom. When the tubing 312 and 314 is inserted into the recesses 316 and 318, the teeth 320 engage and slightly penetrate the outer wall of the tubing. The teeth 320 are oriented so as to resist withdrawal of the tubing 312 and 314 from the recesses. 0-rings 322 seal the coupling unit 310 to substantially eliminate leakage of air (or other transmitted fluid).

The illustrated coupler also provides electrical coupling of the tubing 312 and 314. As noted above, the tubing 312 and 314 has embedded conductive traces. The teeth 320 have conductive external surfaces so that the teeth engage the conductive trace when the teeth penetrate the external surface of the tubing 312 and 314. In this regard, rows of teeth in each recess 316 and 318 can be circumferentially offset from one another such that at least one tooth engages the trace no matter what the angular orientation of the tubing 312 or 314 when it is inserted into the recesses 316 and 318. The teeth 320 of the first and second recesses 316 and 318 are electrically interconnected by leads 324. In this manner, a circuit, e.g., a data center air coolant loop, an be concomitantly wired as it is plumbed.

The center portion of the illustrated coupling unit 310 includes an inner conduit 326 and an outer conduit 328. The spacing between these conduits 326 and 328 may be maintained by radial ribs. These conduits 326 and 328 allow for efficient interconnection of coaxial tubing as described above.

One advantage of the present invention is that the overall cooling system for a data center is provided in a number of modular units. This allows data centers to display cooling as needed and expand capacity at a later time. It is desired that such configuration and reconfiguration be accomplished efficiently without requiring specialized skill. Accordingly, it is desirable that the conduits that make up the air coolant loop can be easily connected and disconnected, such as by coupling units as described above. In addition, it is desirable that airflow automatically be discontinued in the event that a connector is disconnected so as to avoid the discharge of high-velocity, cold air into the ambient environment.

Figure 4A:
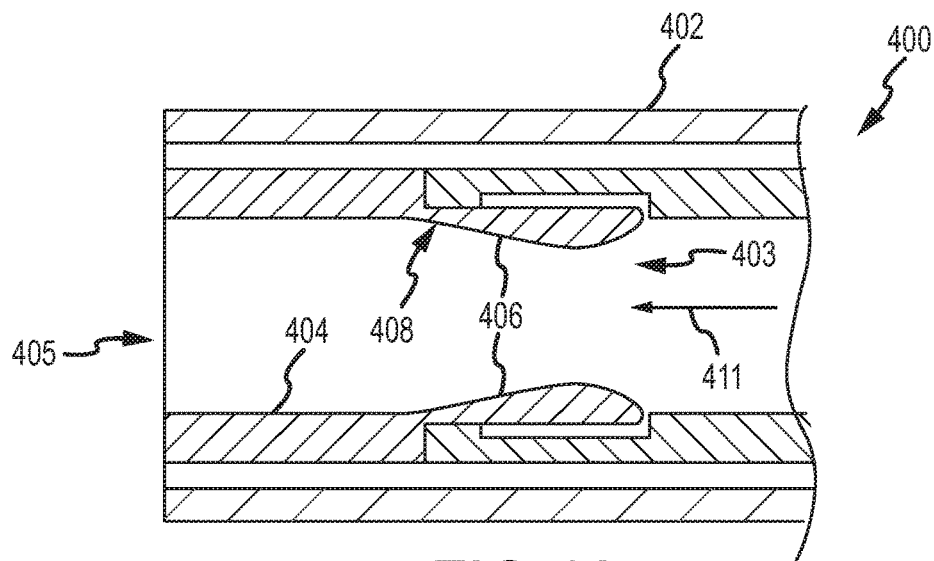
FIG. 4A is a side cross-sectional view of a reed valve assembly incorporated into a tubing section in accordance with the present invention.
Figure 4B:
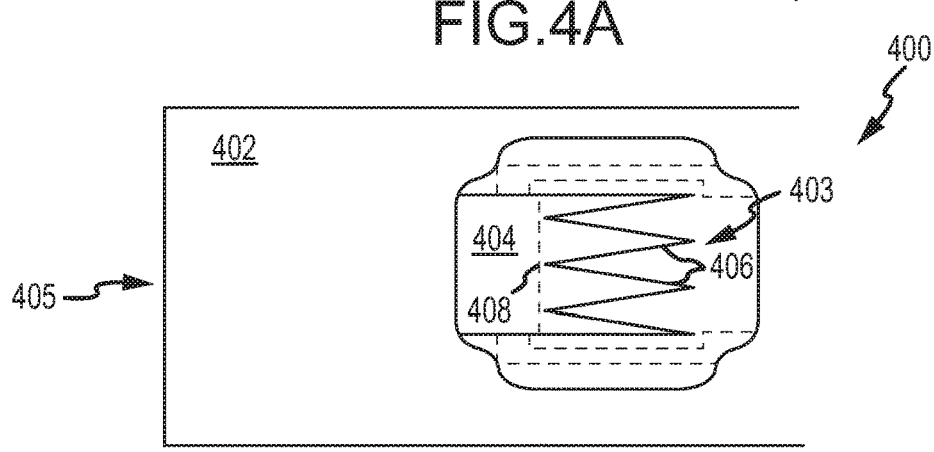
FIG. 4B is a side view, partially cut-away, of the structure of FIG. 4A with the reed valve in an open configuration.
Figure 4C:
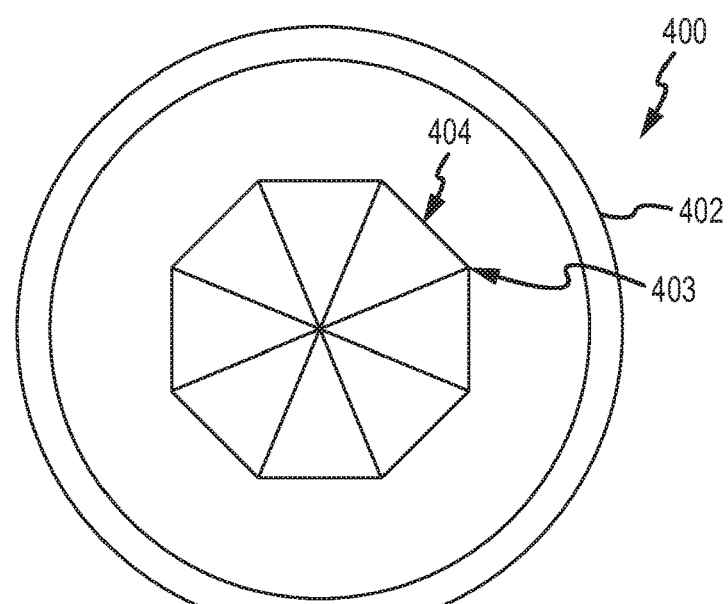
FIG. 4C is an end cross-sectional view of the structure of FIG. 4B with the reed valve in a closed configuration.

FIGS. 4A-4C illustrate a tubing end section 400 to provide the desired functionality. As shown, the end section 400 includes an outer conduit 402 and an inner conduit 404, as described above. A reed valve subassembly 403 is provided at an outlet end 405 of the assembly 400, where the airflow direction is indicated by arrow 411. That is, the outlet end 405 is at the downstream end of the conduit section when the conduit section is incorporated into an air coolant loop. The illustrated valve subassembly 403 includes a number of valve fingers 406 connected to the inner conduit 404 by a hinge 408, such as an integral fabric (e.g., plastic) hinge. Alternatively, a mechanical hinge could be utilized.

In an open configuration, as shown in FIGS. 4A and 4B, the fingers 406 are disposed within a recess formed in the inner conduit 404 so that they do not substantially obstruct airflow through the conduit 404. In a closed configuration, as shown in FIG. 4C, the fingers 406 snap together so as to substantially cut-off air flow. Preferably, the valve subassembly 403 is self-actuating so as to automatically cut-off air flow upon disconnection of a conduit section. That is, when the conduit section is connected within an air coolant loop and air is flowing, the valve subassembly 403 will automatically assume the open configuration of FIGS. 4A and 4B. However, when the conduit section is disconnected, the valve subassembly 403 will automatically assume the closed configuration of FIG. 4C. In this regard, the valve subassembly 403 may be biased towards the open configuration, for example, by internal spring force of the hinge material.

As best seen in FIG. 4A, the illustrated fingers 406 have a cross-section generally shaped like a cambered airfoil. Air flow across the surface of these fingers will draw the fingers radially inwardly. This drawing force will increase when the conduit section is disconnected. By appropriate design of the hinge, air flow across the fingers 406 when the tubing section is incorporated into an air coolant loop and air is flowing will allow the valve assembly to remain in the open configuration. However, when the tubing section is disconnected, the air velocity will momentarily increase dramatically, increasing the aerodynamic lift on the "fingers" lifting them into the oncoming air stream. The tips of the fingers will be drawn into the air stream, which will then snap the fingers into the closed configuration.

The reed valve subassembly 403 will also automatically reopen when the tubing is connected and air is flowing. In particular, the fingers 406, by design, do not form an air-tight seal in the closed configuration. Rather, some air will leak between the fingers or through a small central opening due to rounding of the finger tips. Since the coolant is benign air (though it is cold), this small leakage is not a safety concern. This leakage causes the pressure differential across the reed valve subassembly 403 to reduce until the spring force of the hinge allows the valve subassembly to reopen.

Figure 5:
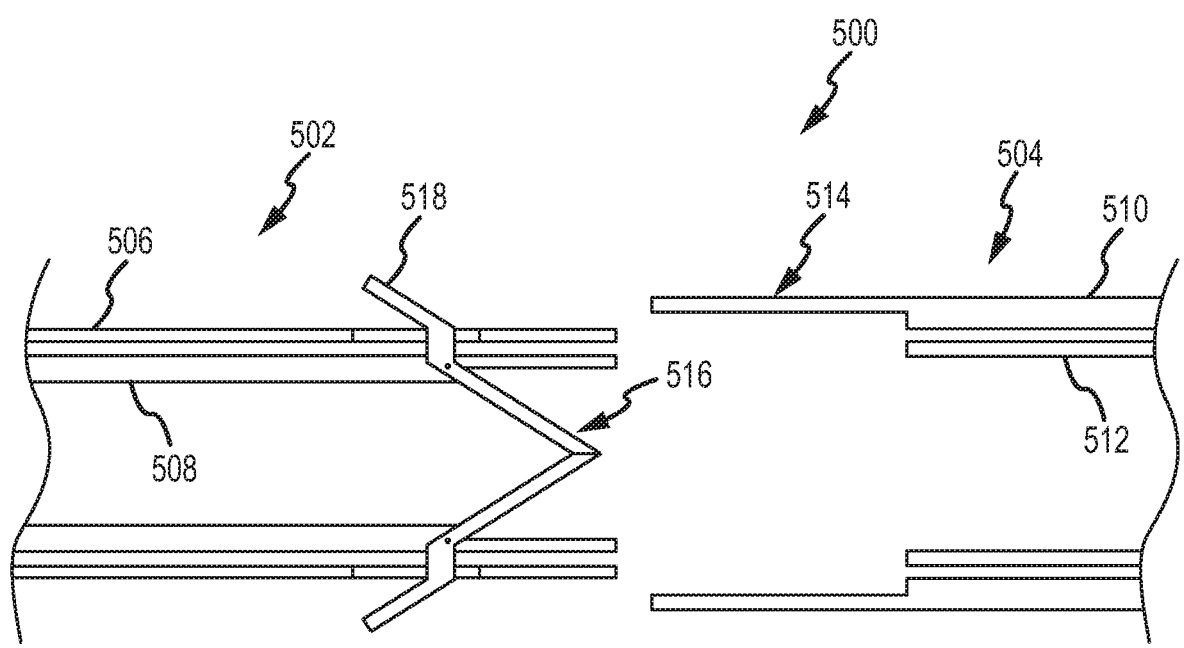
FIG. 5 is a side cross-sectional view of an alternative coupling system for tubing sections in accordance with the present invention; with manually reset reed valve integrated.

An alternative mechanical actuation mechanism is shown in FIG. 5. Specifically, FIG. 5 shows a connection mechanism 500 involving a downstream male end of a first tubing assembly 502 for connection to an upstream female end of a second tubing assembly 504. As described above, the tubing assemblies 502 and 504 include internal conduits 508 and 512 and external conduits 506 and 510. The first tubing assembly 502 includes a reed valve subassembly 516. The reed valve subassembly 516 is hingedly connected to the internal conduit 508 and includes lever arms 518 that extend through an opening such as a slot formed in the external conduit 506. The second tubing assembly 504 includes a flanged section 514 dimensioned to extend over an end section of the first tubing assembly 502. When the tubing sections 502 and 504 are interconnected, the flanged section 514 depresses the lever arms 518 and opens the reed valve 516. The reed valve 516 is biased towards a closed position such that upon disconnection of the assemblies 502 and 504 the valve assembly 516 assumes the closed position as illustrated.

Figure 6:
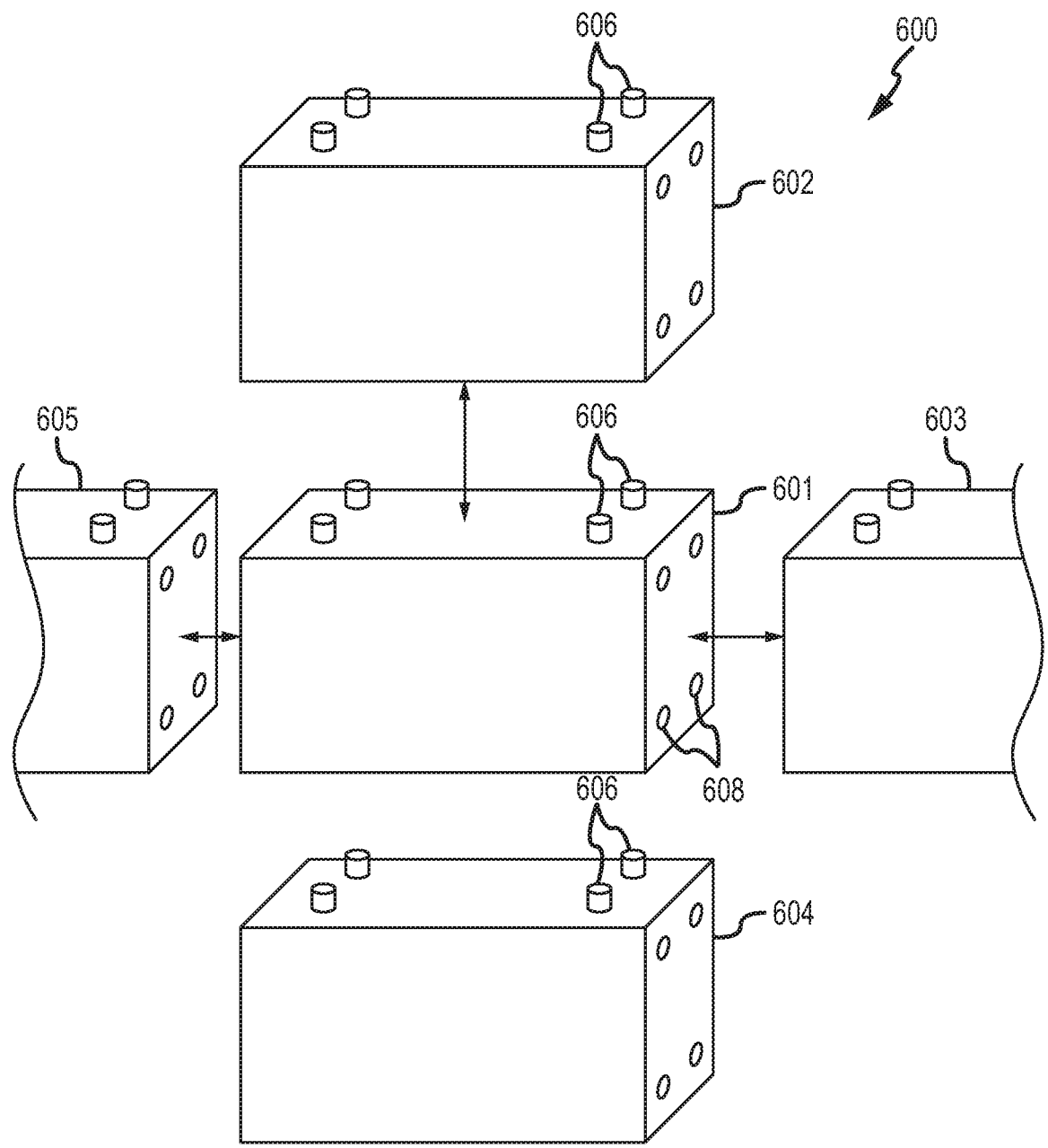
FIG. 6 illustrates modular cooling unit frames in accordance with the present invention.

FIG. 6 illustrates how the cooler units of the present invention can be provided in modular frames to enable any desired two-dimensional or three-dimensional data center topology. As shown in FIG. 6, the system 600 is constructed from a number of modules 601-605. Each of these modules may include, for example, an air-to-Freon cooling unit and associated structure, as described above. The modules 601-605 include registration and interconnection elements to enable interconnection of the modules in horizontal and/or vertical configurations. In the illustrated embodiment, these registration elements include male connectors 606 and female connectors 608 for enabling such connection. Such registration of the modules 601-605 also allows for simple interconnection of electrical and pneumatic structures as between the modules 601-605 if desired.

Figure 7A:
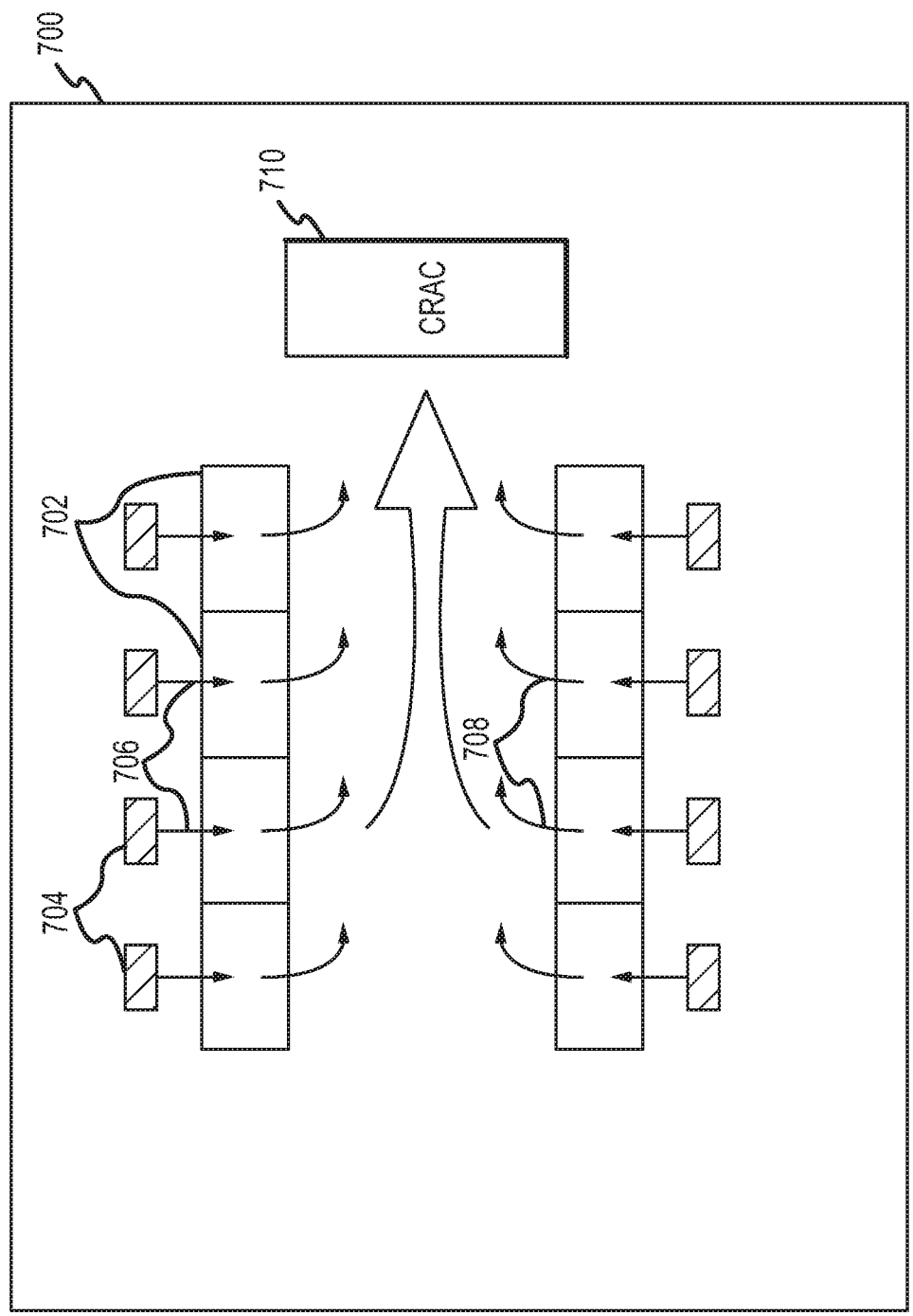
FIG. 7A is a top plan view of a prior art data center showing a hot and cold raw configuration.

The air-based cooling system of the present invention can be implemented using chillers other than door mounted units as described above. In particular, it may be desired to provide a floor or ceiling mounted chiller to address data center hot spots. In this regard, FIG. 7A shows an example of how a well conceived data center 700 may be configured today. The data center 700 includes racks 702 arranged in rows. A computer Room Air Conditioner (CRAC) unit 710 forces cool air into a subfloor plenum space. This cool air (indicated by arrows 706) enters the data center 700 via vents 704 generally disposed adjacent the racks 702. Generally, cool air 706 is blown on the front side of a rack and warm air (generally indicated by arrows 708) exits the back side of the rack.

Adjacent rows of racks are configured so that rack back sides face one another and front sides face one another. The effect is to define alternating warm aisles and cold aisles between rack rows. Preferably, CRAC units 710 are positioned at the ends of warm aisles to draw in the warm air for cooling as shown. However, this preferable configuration is often not applied. For example, there may not be a CRAC unit 710 available. Fore each warm aisle, the result can be hot spots within the data center 700. Even when a preferable configuration is applied, there can be local hot spots, especially towards the tops of racks.

Figure 7B:
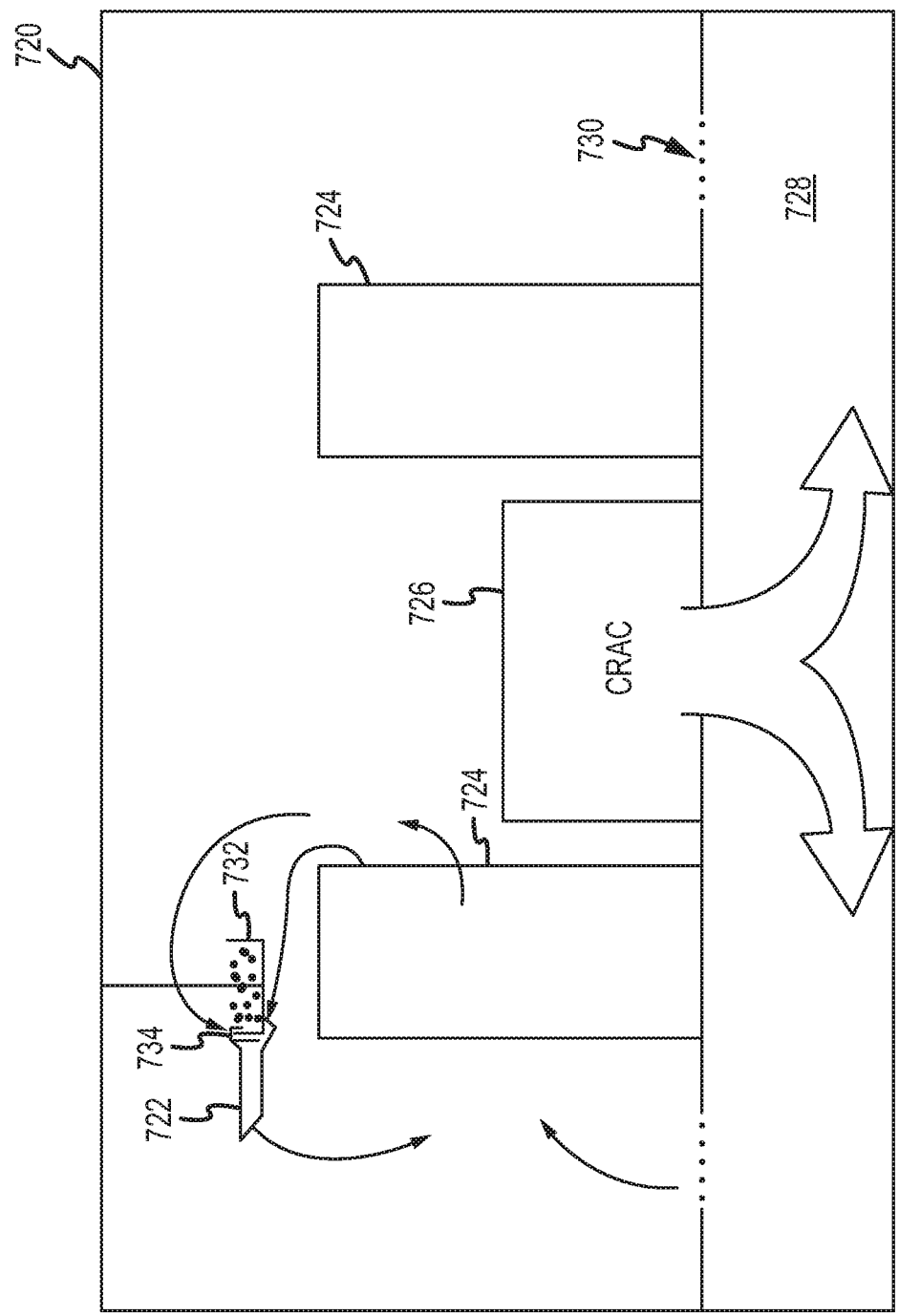
FIG. 7B shows an air-based cooling system in accordance with an alternative implementation of the present invention.

FIG. 7B shows a data center 720 employing a chiller unit 722 in accordance with the present invention. The data center 720 includes rows of racks 724, a CRAC unit 726, a subfloor plenum 728 and vents 730, all generally as described in FIG. 7A. The data center 720 also includes a conventional overhead raceway 732. Because the chiller unit is air-based and can be constructed of light-weight materials, it an be simply hung from the raceway via a bracket 734 or similar mounting hardware. The chiller unit 722 draws warm air from a warm aisle (thereby reducing the load on the CRAC) and drops cold air down on the rack front. This advantageously delivers cooing to the highest equipment in the rack. It will be appreciated, however, that the chiller unit could be floor mounted or at another location.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed:

1. An apparatus for use in a closed-loop, air-based coolant circuit, comprising:
   a conduit assembly comprising:
      a delivery passageway for delivery of coolant air from a cooling unit to a heat exchange site where the coolant air is warmed due to heat exchange; and a return flow passageway for delivery of the coolant air from the heat exchange site to the cooling unit; and a reed valve subassembly configured to obstruct air flow associated with the delivery passageway when a first conduit section of the delivery passageway is disconnected from a second conduit section of the delivery passageway, wherein:

the first conduit section comprises the reed valve subassembly; and each valve finger is operatively associated with a respective lever arm extending from a portion of an outer surface of the first conduit section.

2. The apparatus of claim 1, wherein:

the reed valve subassembly is biased toward the closed configuration wherein each lever arm extends outward from the portion of the outer surface of the first conduit section.

3. The apparatus of claim 2, wherein:

the second conduit section comprises a flanged section dimensioned to extend over the portion of the outer surface of the first conduit section such that each lever arm is depressed by the flanged section when the first conduit section and second conduit section are connected to open the reed valve.

* * * * *